United States Patent [19]

Canestaro et al.

[11] 4,358,479

[45] Nov. 9, 1982

[54] TREATMENT OF COPPER AND USE THEREOF

[75] Inventors: Michael J. Canestaro, Endicott; Edmond O. Fey, Vestal, both of N.Y.

[73] Assignee: International Business Machines Corporation, Armonk, N.Y.

[21] Appl. No.: 211,998

[22] Filed: Dec. 1, 1980

[51] Int. Cl.$^3$ ............................ B05D 5/12; C23F 1/00
[52] U.S. Cl. ..................................... 427/98; 156/630; 156/656; 156/666; 156/902; 427/322
[58] Field of Search ............................ 156/629–634, 156/656, 902, 666; 427/96–98, 299, 302, 304, 305, 307, 322, 306, 430 A; 29/846, 848; 204/15, 23, 29; 430/313, 315, 318

[56] References Cited

U.S. PATENT DOCUMENTS

| | | | |
|---|---|---|---|
| Re. 28,042 | 6/1974 | Rhodenizer et al. | 204/28 B |
| 2,932,599 | 4/1960 | Dahlgren | 156/656 X |
| 3,672,986 | 6/1972 | Schneble et al. | 427/96 |
| 3,846,168 | 11/1974 | Elmore | 252/79.5 X |
| 3,854,973 | 12/1974 | Mersereau et al. | 427/96 |
| 4,110,147 | 8/1978 | Grunwald et al. | 156/306 |
| 4,127,438 | 11/1980 | Babcock et al. | 156/666 |
| 4,144,118 | 3/1979 | Stahl | 156/659.1 |
| 4,188,240 | 2/1980 | Yoshio | 148/6.14 R |
| 4,203,809 | 5/1980 | McKean | 204/32 R |
| 4,216,246 | 8/1980 | Iwasaki et al. | 427/43.1 |

FOREIGN PATENT DOCUMENTS 126096 6/1977 Fed. Rep. of Germany.
137046 8/1979 Fed. Rep. of Germany.

OTHER PUBLICATIONS

Transactions of the Institute of Metal Finishing, 1968, vol. 46, pp. 91-94, The Adhesion of Electroless Metal Deposits to A B S and Other Polymers by Logi et al.
Journal of the Electrochemical Society, Electrochemical Technology, Oct. 1969, pp. 1455-1458, Mechanism of Bonding Electroless Metal to Organic Substrates by Elmore et al.
Metal Finishing, Nov. 1968, pp. 80-84, Adhesion of Electrodeposits to Plastics-An Electron Microscopic Investigation by Matsunaga et al.

*Primary Examiner*—William A. Powell
*Attorney, Agent, or Firm*—Pollock, Vande Sande & Priddy

[57] ABSTRACT

A method for modifying the surface characteristics of copper foil by contacting a surface thereof with an oxidizing composition; and use of the treated copper foil in the preparation of printed circuits.

11 Claims, No Drawings

TREATMENT OF COPPER AND USE THEREOF

DESCRIPTION

1. Technical Field

The present invention is concerned with a method for modifying the surface characteristics of copper foil, and particularly concerned with modifying a nodular or irregular surface of the copper foil. The treated copper foil according to the present invention is especially useful in the preparation of printed circuits whereby such is used as a sacrificial layer to create an irregular surface on the dielectric substrate employed.

2. Background Art

The electroless plating of various metals such as copper and nickel onto a substrate is well known in the prior art. For instance, an electroless of autocatalytic copper plating bath usually contains a cupric salt, a reducing agent for the cupric salt, a chelating or complexing agent and a pH adjuster. In addition, if the surface being plated is not already catalytic for the deposition of the desired metal, a suitable catalyst is deposited on the surface prior to contact with the plating bath. Among the more widely employed procedures for catalyzing a substrate is the use of a stannous chloride sensitizing solution and a palladium chloride activator to form a layer of metallic palladium particles.

One of the major difficulties encountered early on in preparing additive printed circuit boards was obtaining sufficient adhesion between the chemically deposited copper or other conductive metal and the dielectric substrate. One procedure suggested was described in "Transactions of the Institute of Metal Finishing," 1968, Vol. 46, pages 91 to 94. The procedure there suggested involves the successive steps of treating the surface of the bare substrate board with a "keying" agent, punching the board to provide the necessary through holes, plating a very thin initial deposit of nickel over the entire surface using an electroless nickel bath, then applying and developing a resist to form a negative image of the desired circuit pattern, followed by additional metal plating by conventional electrode deposition techniques to build up the conductor portions of the circuit to the desired thickness. After this, the resist strip and the printed circuit board is etched to completely strip away the initial, thin, electroless metal deposit from the non circuit areas, leaving only the heavier plate, i.e. the circuit areas, on the board. The board is then treated in the normal way to provide a protective film of precious metal or lacquer on the printed conductor circuit, or alternatively to cover this with solder coating to facilitate connection of the usual accessory electronic components incorporated into the finish circuit board.

Although such method does provide certain advantages, difficulties still exist. For instance, one particular difficulty with that described method is in the use of a "keying" agent which, although not fully identified in said article, appears to be a polymeric coating. Careful preparation and application of the coating material is needed to obtain effective and consistent results. In addition, problems exist in obtaining the proper dielectric properties of the adhesive, accurate and consistent reproducibility of the polymeric bonding material, and in avoiding fragility or brittleness of the bond. Moreover, it seems that this above discussed process is more suitable for thermoplastic resin substrates than thermosetting substrates. However, thermosetting substrates are preferred for electronic applications and particularly for printed circuit boards.

Subsequent to this, a process was suggested which employs a sacrificial metal layer. Briefly, such process includes laminating a sheath or film of a metal such as copper, nickel or aluminum onto the surface of the dielectric substrate. The metal film is then stripped or etched completely from the substrate prior to application of any circuitry. This technique creates an irregular surface on the dielectric substrate, which in turn, provides for improved bonding sites for the subsequently plated additive metal. However, certain problems still exist in preparing printed circuit boards by this method. One such problem is the existence of voids in the plated metal coatings. Also, improvement in definition of patterns of the circuitry lines would be desirable.

SUMMARY OF THE INVENTION

The present invention makes it possible to significantly reduce if not eliminate plating voids. In addition, the present invention results in good adhesion of the photo resist material which in turn facilitates good line definition. The improvement with respect to the reduction and/or elimination of plating voids may be due to some extent to a greater tendency of the catalyst or "seeder" particles to be held by the dielectric substrate as compared to prior methods. It has been observed that according to the practice of the present invention the seeder particles have less tendency to be washed off in the plating bath during the early phases of the plating operation as compared to the above discussed prior "sacrificial" film method.

The present invention is concerned with modifying the surface characteristics of copper foil which has at least one nodular or irregular or rough surface. The method includes contacting a nodular or irregular surace of the copper foil with an oxidizing composition for a time sufficient to oxidize the nodular surface of the copper foil in order to further roughen the nodular surface. The preferred treating composition is an aqueous alkaline solution of sodium chlorite. The solution contains about 2 to about 10 percent by weight of sodium chlorite and about 0.3 to about 0.7 percent by weight of sodium hydroxide.

In addition, the present invention is concerned with a method for preparing a printed circuit which comprises:

A. Contacting a nodular surface of a copper foil with oxidizing composition for a length of time sufficient to oxidize the nodular surface of the copper foil to further roughen the nodular surface;

B. Laminating the copper foil and a dielectric substrate material together with the nodular surface confronting the surface of the substrate;

C. Removing the copper from the substrate by immersion in an etching bath; and

D. Plating the substrate with conductive metal.

In addition, the present invention is concerned with copper foil treated by the above described method.

DESCRIPTION OF BEST AND VARIOUS MODES

The copper foil treated according to the present invention must have at least one surface thereof which is nodular or irregular. Such foils are commercially available and can be prepared by nodular plating processes. Particular copper foils employed according to the present invention have one very smooth surface while the other surface is nodular. Such are commercially available from Gould and Yates and are generally referred to as electrodeposited copper foils.

The particular foil employed is about one ounce/square foot, about two ounces/square foot, or about 12 microns thick.

The copper foil is treated according to the present invention by contacting the foil with an oxidizing composition for a length of time sufficient to oxidize the nodular surface of the copper foil in order to further roughen the nodular surface thereof. In particular, the preferred oxidizing composition employed contains about 2 to about 10 and most preferably about 5.5 to about 6.5 percent by weight of an alkali metal chlorite such as sodium chlorite; and about 0.3 to about 0.7 percent by weight of an alkali metal hydroxide such as sodium hydroxide.

The composition is generally at elevated temperatures during the treatment and preferably is at temperatures of about 140° to about 200° F. and most preferably about 185° to about 195° F. At such temperatures, the treatment of the copper foil is completed within about ½ to about 5 minutes.

The copper foil treated according to the present invention includes both macronodules as received and much smaller micronodules due to the particular treatment of the present invention. The micronodules are one tenth or less the size of the macronodules already on the copper foil.

The copper foil treated according to the present invention after treatment is then rinsed in deionized water and dried by air or oven device.

The copper foil treated according to the present invention is then laminated to a dielectric substrate material. The dielectric substrate material includes both thermoplastic and thermosetting polymers and preferably thermosetting polymers. Typical thermosetting polymeric materials to which the copper foil is laminated include epoxy, phenolic based materials, and polyimides. The dielectric materials may be molded articles of the polymers containing fillers and/or reinforcing agents such as glass filled epoxy or phenolic based materials. Examples of some phenolic type materials include copolymers of phenol, resorcinol and cresol. Examples of some suitable thermoplastic polymeric materials include polyolefins, such as polypropylene; polysulfones, polycarbonates, nitrile rubbers, and ABS polymers.

Bonding of a dielectric material substrate to the copper foil is carried out by pressing together a sheet of the dielectric substrate material and a sheet of the copper foil prepared according to the present invention with the treated surface next to or confronting the dielectric material, in a preheated laminating press at a predetermined pressure and temperature as for example about 260 to about 800 psi and preferably about 500 psi and about 340° F. The time of the pressing operation is variable depending upon the particular dielectric substrate material employed and the pressure employed. About 1 hour is adequate for the above conditions. The pressing can be done by loading a stack of panels on top of each other in the press. A practical amount is about 12 panels.

Next, the copper foil is removed from the entire dielectric substrate surface chemically by treating with an etchant and preferably by immersion of the structure into the etching bath. Copper etchant compositions are well known and include for instance solutions of cupric chloride, ferric chloride, sodium peroxydisulfate, ammoniacal chlorite, ammoniacal persulfate, and nitric acid. In general, all stripping solutions are operative in the practice of the present invention so long as they do not cause excessive attach of the dielectric substrate material.

After this, it is generally suitable to subject the board to a water rinse and/or a mild alkali bath rinse to clean the board. Next, generally the dielectric substrate is then catalyzed by for instance a two-step activation procedure using stannous chloride in hydrochloric acid, followed by a dip in palladium chloride in hydrochloric acid or by a one-step procedure employing a ten-palladium hydrosol. In addition, it may be desirable to subject the catalyzed board to an accelerating solution of for instance, a dilute solution of suitable acid or alkali.

For a further discussion of various seeder compositions and processes of applying same, attention is directed to U.S. Pat. Nos. 3,099,608, 3,632,388 and 4,066,809, disclosures of which are incorporated herein by reference.

After sensitization, the desired circuit pattern is defined by conventional photo resist process. For instance, a negative photo resist material is applied to the substrate, and then by use of a mask, the photo resist is subjected to light of suitable wavelength to cause crosslinking or curing of the photo resist. Then, unexposed photo resist material is removed by treating with a chemical such as methyl chloroform in areas where the circuitry is to be plated. Suitable photo resist materials are well known in the art and need not be discussed herein in any great detail. Many of such are available from Du Pont. The areas in which the photo resist is removed are those areas where the circuitry is to be plated.

Next, the metal such as nickel or copper is plated preferably by electroless plating onto those preselected areas of the dielectric substrate which do not contain the photo resist material. The metal is coated to the desired thickness of the circuitry. The preferred metals employed are nickel and copper, and most preferably copper. The preferred copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjuster. The plating baths also preferably include a cyanide ion source and a surface-active agent.

The cupric ion source generally used is a cupric sulfate or a cupric salt of the complexing agent to be employed. When employing cupric sulfate, it is preferred to use amounts from about 3 to about 15 grams/liter and most preferably from about 8 to about 12 grams/liter. The most common reducing agent employed is formaldehyde which in the preferred aspects of the present invention is used in amounts from about 0.7 to about 7 grams per liter and most preferably from about 0.7 to about 2.2 grams per liter. Examples of some other reducing agents include formaldehyde precursors or derivatives such as paraformaldehyde, trioxane, dimethyl hydantoin, glyoxal; borohydrides such as alkali metal borohydrides (sodium and potassium borohydride) and substituted borohydrides such as sodium trimethoxyborohydride; boranes such as amineboran (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrilo triacetic acid and its alkali salts, gluconic acid, gluconates, triethanol amine, glucono-(gamma)-lactone, modified ethylene diamine acetates such as N-hydroxy-ethyl ethylene diamine triacetate. In addition, a number of other suitable cupric complexing agents are suggested in U.S. Pat. Nos. 2,996,408, 3,075,856, 3,075,855 and 2,938,805. The amount of complexing agent is dependent upon the amount of cupric ions present in the solution and is generally from about 20 to about 50 grams/liter, or in a 3-4 fold molar excess.

The plating bath can also contain a surfactant which assists in helping to wet the surface to be coated. A satisfactory surfactant is, for instance, an organic phosphate ester available under the trade designation Gafac RE-610. Generally, the surfactant is present in amounts from about 0.02 to about 0.3 grams/liter. In addition, the pH of the bath is also generally controlled, for instance, by the addition of a basic compound such as sodium hydroxide or potassium hydroxide in the desired amount of achieve the desired pH. The preferred pH of the electroless plating bath is between 11.6 and 11.8.

Also preferably, the plating bath also contains a cyanide ion and most preferably contains about 10 to about 25 miligrams per liter to provide a cyanide ion concentration in the bath within the range of 0.0002 to 0.0004 molar. Examples of some cyanides which can be employed according to the present invention are the alkali metal, alkaline earth metal, and ammonium cyanides such as sodium, potassium, calcium and ammonium cyanide. In addition, the plating baths can include other minor additives as is well known in the prior art.

The preferred plating baths employed have a specific gravity within the range of 1.060 to 1.080. In addition, the temperature of the bath is preferably maintained between 70° and 80° C. and most preferably between 70° and 75° C. For a discussion of the preferred plating temperatures coupled with the preferred cyanide ion concentrations, see U.S. Pat. No. 3,844,799.

Also, it is preferred to maintain the $O_2$ content of the bath between about 2 ppm and 4 ppm and preferably about 2.5 to 3.5 ppm as discussed in U.S. Pat. No. 4,152,467. The $O_2$ content can be controlled by interjecting oxygen and an inert gas into the bath.

The overall flow rate of the gases into the bath is generally from about 1 to about 20 SCFM per 1000 gallons of bath and preferably from about 3 to about 8 SCFM per 1000 gallons of bath.

The following non-limiting examples are presented to further illustrate the present invention.

EXAMPLE 1

A one ounce/ft.$^2$ copper foil is immersed into a bath containing about 6 percent by weight sodium chlorite, and about 0.5 percent by weight of sodium hydroxide. The temperature of the bath is about 190° F. and the contact of the copper foil with the bath is for about 90 seconds.

The copper foil treated according to the above procedure is laminated to an expoxy-fiberglass composite. The nodular side of the treated foil confronts the epoxy-fiberglass composite. The laminate is then dipped into a hot sodium peroxy-disulfate etchant solution to remove the copper foil from the entire surface of the laminate. The solution is at a temperature of about 110° F.

Next, the epoxy-fiberglass laminate is seeded with stannous chloride and palladium chloride to provide a palladium metal seed on the surface thereof. The desired circuitry is then defined by conventional photo resist process employing a negative photo resist. After this, copper is selectively plated onto the substrate to the desired thickness of the circuitry by contacting with an electroless plating bath containing about 10 grams per liter of $CuSO_4$—$5H_2O$, 35 grams per liter of ethylene diamine tetraacetic acid dihydrate, 0.25 grams per liter of GAFAC RE-610, 14 milligrams per liter sodium cyanide, 2 ml/l 37 percent HCHO. The specific gravity of the plating bath is about 1.07, the pH is 11.70 by the addition of NaOH, and the temperature of the bath is 73° C. ±5° C. The $O_2$ content of the bath is maintained at about 2.5-3.5 ppm. The gas flow rate is about 12 SCFM. In addition, the plating racks are continuously agitated during the plating. Plated boards are inspected for voids and the results show no voids in any plating process. In addition, the peel strength of the copper layer is about 8 pounds per inch with a one hour bake at about 250° F. The boards also exhibit good line definition. The insulation resistant remains at about $10^{10}$ ohms after 300 hours exposure to 50° C. at 80 percent relative humidity. It is further noted that the peel strength is not affected by the position of the particular laminate in the press load or stack as in other systems.

EXAMPLE 2

The above plating process is repeated except that the copper foil employed is not subjected to the chlorite bath treatment of the present invention. The boards obtained show large amounts of plating voids. It is noted that the peel strength though is somewhat higher than that achieved in the present invention. However, the peel strength achieved by the present invention although being somewhat less is not seen to be detrimental to the effectiveness of the final products and is certainly an acceptable sacrifice to achieving the void free products achievable by the present invention.

It is further noted, that the practice of the present invention provides for excellent adhesion with the coated metal, the seeder compositions, and the photo resist employed. On the other hand, the adhesion of the seeder composition to the dielectric substrate when the rough surface of a non-treated copper foil is employed is less than that achieved by the present invention. If the smooth side of the copper foil is treated according to the present invention and it is laminated to the dielectric, the subsequent photo resist adhesion is poor.

Having thus described our invention, what we claim as new, and desire to secure by Letters Patent is:

1. A method for preparing a printed circuit which comprises:
   (A) contacting a nodular surface of a copper foil with an oxidizing composition for a length of time sufficient to oxidize said nodular surface of said copper foil to further roughen said nodular surface;
   (B) laminating the copper foil and dielectric substrate material together with said nodular surface confronting the surface of said substrate;
   (C) removing the copper from said substrate etching;
   (D) catalyzing said substrate for electroless metal deposition subsequent to removing the copper in step (C); and
   (E) electrolessly plating the substrate with conductive metal.

2. The method of claim 1 wherein said oxidizing composition is an alkali chlorite solution.

3. The method of claim 1 wherein the composition is at a temperature of about 185° to about 195° F.

4. The method of claim 1 wherein said nodular surface is oxidized in step (C) to provide micronodules on the oxidized surfaces which are one tenth or less the size of the nodules already on the copper foil prior to the oxidizing.

5. The method of claim 1 wherein said oxidizing composition is an alkali chlorite solution containing alkali metal chlorite in a concentration of about 2 to about 10 percent by weight and alkali metal hydroxide in a concentration of about 0.3 to about 0.7 percent by weight.

6. The method of claim 5 wherein said alkali metal chlorite is sodium chlorite and said hydroxide is sodium hydroxide.

7. The method of claim 5 wherein the concentration of said chlorite is about 5.5 to about 6.5 percent by weight.

8. The method of claim 1, 2, 5 or 6 wherein said composition is at a temperature of about 140° to about 200° F.

9. The method of claim 2, 5, 6, or 1 wherein said dielectric substrate includes an epoxy resin.

10. The method of claim 2, 5, 6, or 1 wherein said conductive metal is copper.

11. The method of claim 2, 5, 6, or 1 wherein said etching is carried out by immersion in an etching bath.

* * * * *